United States Patent
Wang

(10) Patent No.: US 11,770,141 B2
(45) Date of Patent: Sep. 26, 2023

(54) SWITCH DEVICE, SYSTEM AND CORRESPONDING METHODS

(71) Applicant: Infineon Technologies AG, Neubiberg (DE)

(72) Inventor: Kun Wang, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 42 days.

(21) Appl. No.: 17/339,018

(22) Filed: Jun. 4, 2021

(65) Prior Publication Data

US 2021/0399748 A1 Dec. 23, 2021

(30) Foreign Application Priority Data

Jun. 22, 2020 (EP) .................................. 20181343

(51) Int. Cl.
*H04B 1/44* (2006.01)
*H04B 1/00* (2006.01)
*H03H 7/01* (2006.01)

(52) U.S. Cl.
CPC ........... *H04B 1/006* (2013.01); *H03H 7/0115* (2013.01)

(58) Field of Classification Search
CPC ........ H04B 1/006; H04B 1/44; H03H 7/0115; H03H 7/38
See application file for complete search history.

(56) References Cited

U.S. PATENT DOCUMENTS

| 9,419,775 | B2* | 8/2016 | Granger-Jones | H04L 5/08 |
| 9,685,687 | B2* | 6/2017 | Solomko | H01P 5/18 |
| 9,837,324 | B2 | 12/2017 | Blin et al. | |
| 2012/0081262 | A1 | 4/2012 | Tanaka et al. | |
| 2012/0249270 | A1 | 10/2012 | Li et al. | |
| 2015/0054698 | A1 | 2/2015 | Kerr et al. | |
| 2019/0296436 | A1 | 9/2019 | Desclos et al. | |
| 2019/0363440 | A1 | 11/2019 | Samardzija et al. | |
| 2021/0160878 | A1* | 5/2021 | Samardzija | H04B 1/48 |

FOREIGN PATENT DOCUMENTS

EP 3016200 A1 5/2016

* cited by examiner

*Primary Examiner* — Tuan Pham
(74) *Attorney, Agent, or Firm* — Slater Matsil, LLP

(57) ABSTRACT

In an implementation, an integrated switch device includes a set of first ports; a set of first switches, wherein each first switch of the set of first switches is coupled between a respective first port of the set of first ports and ground, and wherein the first ports are only coupled to the first switches within the integrated switch device; a set of second ports; a set of third ports; a set of second switches, wherein each second switch is coupled between a respective second port of the set of second ports and a respective third port of the set of third ports; and a set of third switches, wherein each switch of the set of third switches is coupled between the respective third port and ground.

18 Claims, 11 Drawing Sheets

SWITCH DEVICE, SYSTEM AND CORRESPONDING METHODS

This application claims the benefit of European Application No. 20181343.3, filed on Jun. 22, 2020, which application is hereby incorporated herein by reference in its entirety.

TECHNICAL FIELD

The present application relates to integrated switch devices usable for example for tuning applications, like tuning of radio frequency antennas, to systems and to corresponding methods.

BACKGROUND

In radio frequency devices, for antenna tuning inductive and capacitive tuning elements may be selectively coupled to an antenna. One approach is sometimes referred to as aperture tuning, where the inductive or capacitive tuning elements are selectively coupled between the antenna and ground, for example at a node between the antenna and radio frequency communication circuitry coupled to the antenna. This is for example used for band selection in mobile phones which are able to communicate in different frequency bands.

Various approaches how to selectively couple the tuning elements to the antenna are known, like shunt type switch, series type switch or series type switch with so-called resonance stopper.

While such tuning may improve device performance in some cases, it may also lead to losses and unwanted resonances in the system.

SUMMARY

According to an embodiment, an integrated switch device is provided, comprising:
a set of first ports,
a set of first switches, wherein each first switch is coupled between a respective first port and ground, wherein within the integrated switch device the first ports are only coupled to the first switches,
a set of second ports,
a set of third ports,
a set of second switches, wherein each second switch is coupled between a respective second port and a respective third port, and
a set of third switches, wherein each switch of the set of third switches is coupled between a respective third port and ground.

According to another embodiment, a system is provided, comprising:
a set of single pole single throw, SPST, switches configured to selectively couple respective first ports to ground, wherein each port of the set of first ports is coupled to a first terminal of a capacitor,
a set of single pole x throw, SPxT, switches configured to couple a set of second ports selectively either to ground or to one or more inductors.

According to a further embodiment, a method is provided, comprising:
operating tuning capacitors using single pole single throw switches without resonance stopper switch to selectively couple the tuning capacitors to ground, and
operating tuning inductors by selectively coupling the tuning inductors to ground or to an antenna node.

The above summary is merely intended to give a brief overview over some embodiments and is not to be construed as limiting in any way.

DETAILED DESCRIPTION OF ILLUSTRATIVE EMBODIMENTS

In the following, various embodiments will be discussed referring to the attached drawings. These embodiments are given by way of example only and are not to be construed as limiting in any way. For example, while embodiments may be described as comprising a plurality of features (for example components, elements, acts, events etc.), in other embodiments some of these features may be omitted or may be replaced by alternative features. In addition to the features explicitly shown and described, other features may be provided, for example features conventionally employed in mobile communication circuits, radio frequency circuits or antenna tuning circuits. As such additional features are conventional, they will not be described in detail herein.

Features from various embodiments may be combined unless noted otherwise. Variations and modification described with respect to one embodiment may also be applied to other embodiments and will therefore not be described repeatedly.

Connections or couplings described herein refer to electrical connections or couplings, either wireless or wire-based. Such connections or couplings may be modified, for example by adding elements or removing elements, as long as the general purpose of the connection or coupling, for example providing a tuning, providing a voltage or providing a current, is essentially maintained.

A "set" of items, for example a set of switches or set of ports, refers to one or more of these items. For example, a set of switches may include only one switch, but may also include a plurality of switches.

Figure 1:
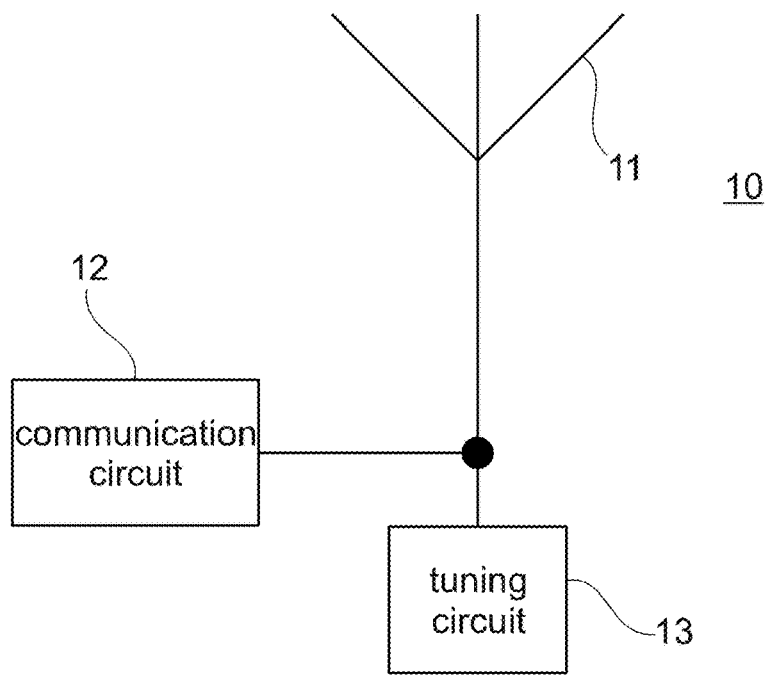
FIG. 1 is a diagram illustrating a system according to some embodiments.

FIG. 1 is a high level block diagram of an example system 10 according to some embodiments. System 10 comprises an antenna 11 coupled to a communication circuit 12. Communication circuit 12 may be a circuit in a communication device, for example a mobile phone or other communication device, which is configured to transmit radio frequency (RF) signals via antenna 11, to receive signals via antenna 11 or both. It should be noted that while a single antenna 11 is shown, this single antenna may in fact represent a plurality of antennas, for example antennas of a so-called phased array.

Furthermore, a tuning circuit 13 is coupled to antenna 11. Tuning circuit 13 comprises capacitors and inductors, which may be selectively coupled to antenna 11 via a plurality of switches, which may be provided as an integrated switch device. Such a switch device may be implemented according to embodiments as discussed below, to provide different kinds of couplings in the same system, for example different kinds of couplings for tuning capacitors and tuning inductors, as will be described below in more detail.

Switch devices according to different embodiments will now be described with references to FIGS. 2 and 3. Switch devices described herein may comprise a plurality of ports. The ports may be used to couple external components to the switch device. The switch devices may be integrated switch devices implemented on a single chip. In other embodiments, they may include two or more chips integrated in a single package.

Figure 2:
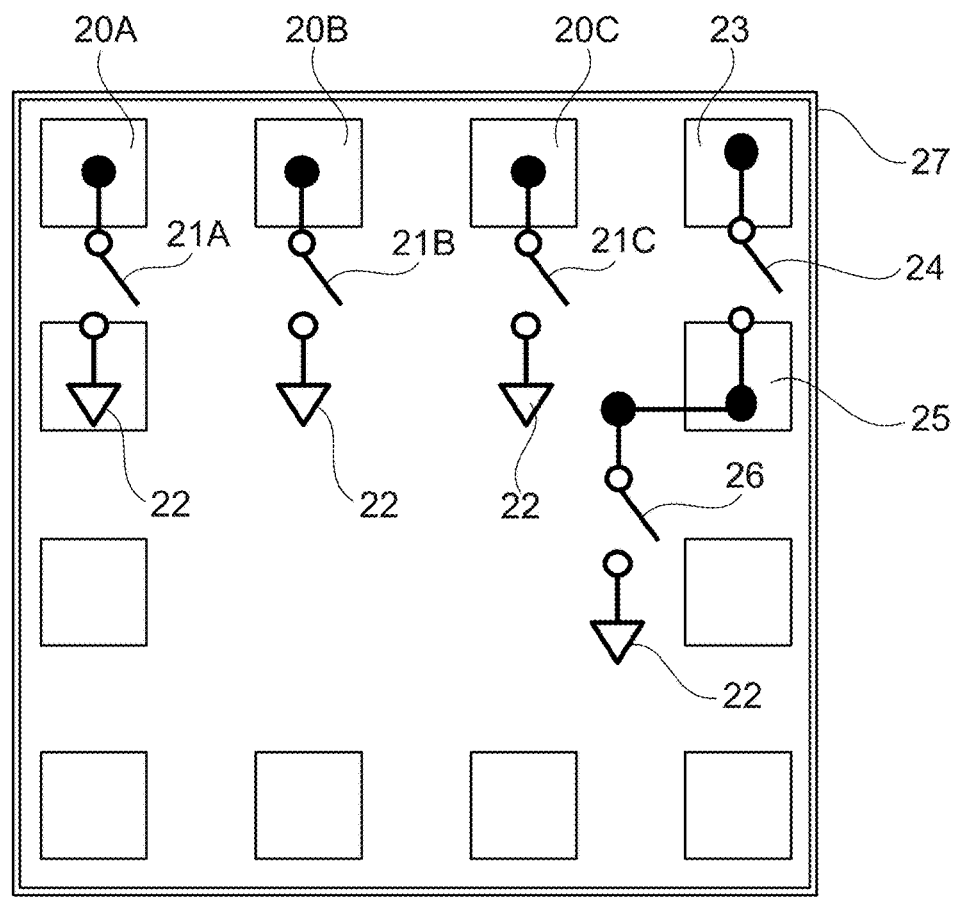
FIG. 2 is a diagram illustrating an integrated switch device according to an embodiment.
Figure 3:
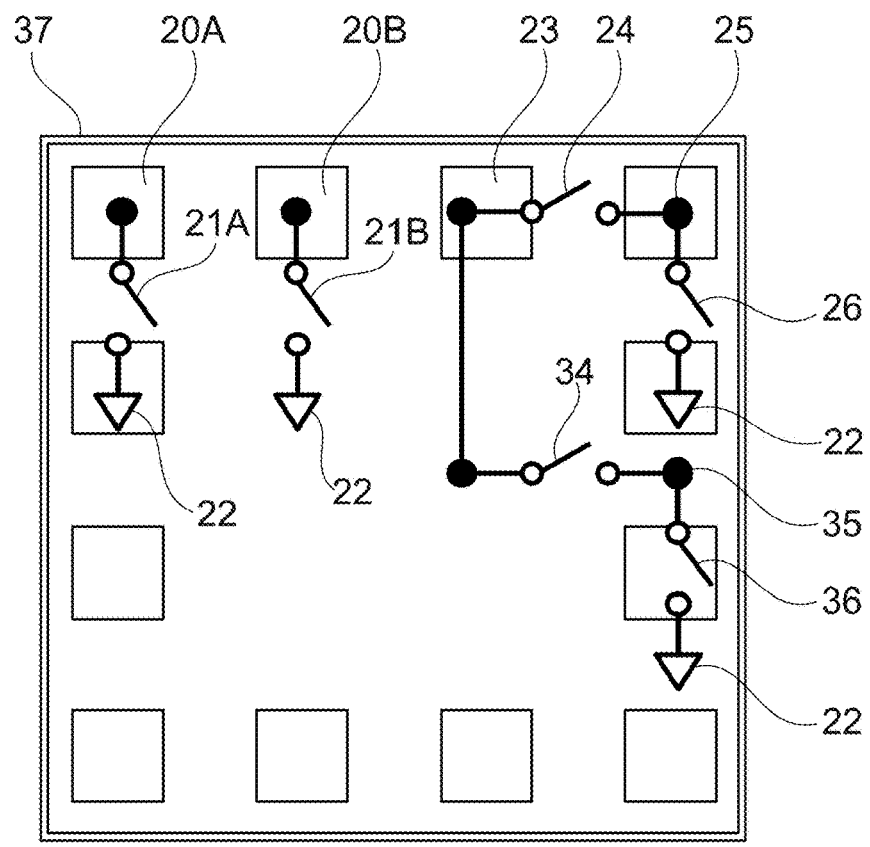
FIG. 3 is a diagram illustrating an integrated switch device according to an embodiment.

The switch devices shown in FIGS. 2 and 3 comprise a plurality of switches. As will be described below, switches may be implemented using transistors like field effect transistors (FETs), bipolar junction transistors (BJTs) or insulated gate bipolar transistors (IGBTs). For applications where higher voltages need to be switched, for example voltages above 10 V, voltages above 20 V, voltages above 30V or higher (for example 60V), a plurality of transistors may be coupled in series to form a switch. Therefore, switches as used herein may be made of a plurality of components, for example a plurality of transistors. A switch is described as on if it provides a low-ohmic connection between its terminal, and is described as off if it is essentially isolating (apart from leakage currents) between its terminals.

FIG. 2 illustrates an integrated switch device 27 according to an embodiment.

In the embodiment of FIG. 2, switch device 27 comprises a set of first ports 20, in the example shown three first ports 20A, 20B and 20C. Each first port 20 may be selectively coupled to a circuit ground 22 via a respective first switch 21 (21A, 21B and 21C in the example shown in FIG. 2) of a set of first switches 21. The number of three first ports 20 and correspondingly three first switches 21 is merely an example, and other numbers of first ports 20 and correspondingly first switches 21 may also be provided. Circuit ground 22 may be coupled to a system ground.

First switches 21A in operation may be used as SPST (single pole single throw) switches for tuning, where for example a respective tuning element like a capacitor is coupled between each first port 20 and an antenna node.

Furthermore, switch device 27 comprises a second port 23 and a third port 25, which may be selectively coupled with each other via a second switch 24. Furthermore, third port 25 may be selectively coupled to circuit ground 22 via a third switch 26. In operation, for example an antenna node may be coupled to second port 23, and a tuning element, for example an inductor, may be coupled with one terminal to third port 25 and with the other terminal to ground. This enables a SPST configuration with third switch 26 acting as a so-called resonance stopper switch. In operation, when second switch 24 is on (enabling the tuning element coupled to third port 25 for antenna tuning), third switch 26 is off and vice versa.

As mentioned, this configuration may for example be used for an inductor. By using resonance stopper switches only for inductors and not for capacitors, in some implementation power losses may be reduced, as will be explained below in more detail. While a single second port 23, third port 25, second switch 25 and third switch 26 is shown, a plurality of such second ports, third ports, second switches and third switches may be provided in other embodiments.

FIG. 3 is a diagram illustrating an integrated switch device 37 according to a further embodiment. In order to avoid repetitions, when explaining switch device 37 reference will be made to the explanation of switch device 27 with respect to FIG. 2, and corresponding elements bear the same reference numerals and will not be described repeatedly.

Switch device 37, similar to switch device 27, comprises a set of first ports 20 coupled to circuit ground 22 via respective first switches 21. In the example of FIG. 3, two first ports 20A, 20B and correspondingly two first switches 21A, 21B are shown. This is again merely an example, and other numbers of first ports and correspondingly first switches may also be used.

As already explained for switch device 27, in an antenna tuning, applications tuning elements, in particular capacitors, may be coupled between first ports 20 and an antenna node for tuning.

Furthermore, switch device 23 comprises a second port 23, which is coupled to a third port 25 via a third switch 24. Third port 25 is coupled to circuit ground 22 via a third switch 26.

Additionally, second port 23 is coupled to a fourth port 35 via a fourth switch 34. Fourth port 35 is coupled to circuit ground 22 via a fifth switch 36. Second, third and fourth ports 35 together with second, third, fourth and fifth switches 36 realize a single port double throw (SPDT) switch configuration with resonance stopper switches (essentially, fourth port 35 and fourth and fifth switches 34, 36 expand the SPST with resonance stopper switch configuration of FIG. 2 to a SPDT configuration with resonance stopper switches). While a single such SPDT with resonance stopper switches configuration is shown in FIG. 3, in other embodiments more than one such configuration may be present. Furthermore, also the switches may be further expanded to higher number of "throws" with resonance stopper, for example SP3T, triple throw).

In operation, an antenna node may for example be coupled to second port 23, and tuning elements, in particular inductors, may be coupled to third port 25 and fourth port 35. In operation, switches 24 and 26 may operate as discussed with reference to FIG. 2, i.e. when one of the switches is off, the other is on, and in a similar manner, switches 34, 36 may be operated such that when one of the switches is on the other is off.

Furthermore, the embodiments of FIGS. 2 and 3 may be combined for example providing one or more first ports 20 associated with first switches 21, one or more second ports 23 associated with third ports 25 and second and third switches 24, 26 only, as in FIG. 2, and additionally one or more second ports 23 associated with respective third ports 25, forth ports 35 and second to fifth switches 24, 26, 34 and 36 as in FIG. 3.

Figure 4:
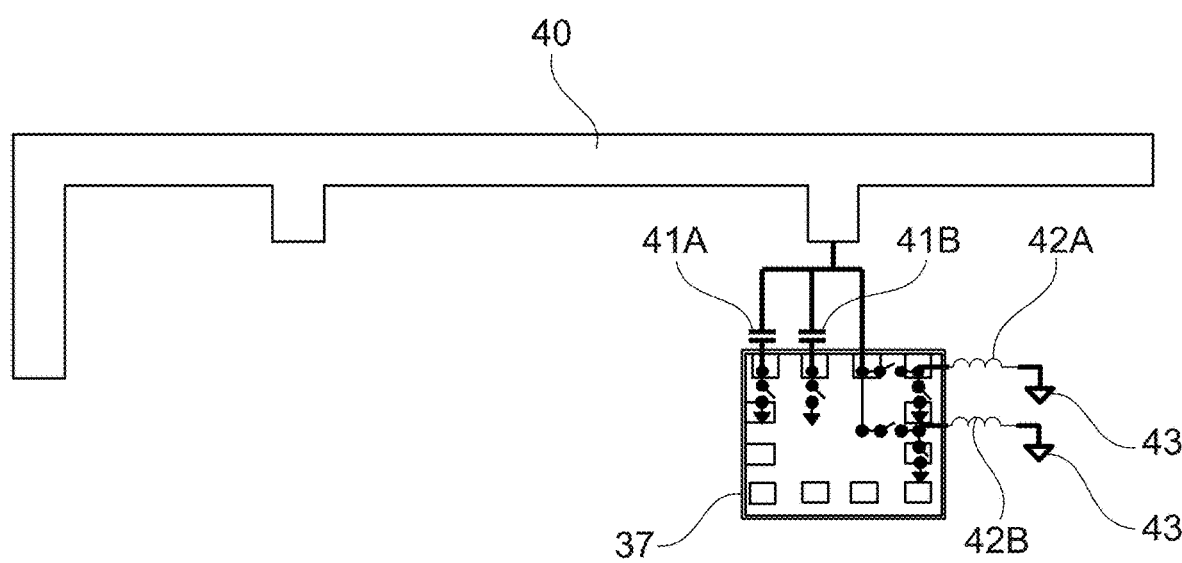
FIG. 4 is a diagram showing an application example of FIG. 3.

FIG. 4 illustrates an application example of switch device 37 for antenna tuning. While switch device 37 of FIG. 3 is used as an example, in other embodiments other switch devices as discussed herein, for example switch device 27, may be used for antenna tuning. In the system of FIG. 4, switch device 37 is used for tuning an antenna 40. Antenna 40 is coupled to first terminals of tuning capacitors 41A, 41B. Second terminals of tuning capacitors 41A, 41B are coupled to respective first ports 20A, 20B of switch device 37. Therefore, switches 21A, 21B form a set of SPST switches without resonance stopper switches, which selectively couple tuning capacitors 41A, 41B to ground.

Furthermore, antenna 40 is coupled to second port 23 of switch device 37. Third port 25 and fourth port 35 are coupled to respective first terminals of tuning inductors 42A, 42B as shown in FIG. 4. Second terminals of tuning inductors 42A, 42B are coupled to ground. Therefore, switches 24, 26, 34 and 36 form a set of SPDT switches with resonance stopper switches, which selectively coupled tuning inductors 42A, 42B to second port 23 and therefore to antenna 40 (when switches 24 or 34 are on) or to ground (when switches 26 or 36 are on).

In contrast to conventional approaches that only use one type of switch configuration for capacitors and inductors, using switch devices like switch device 27, 37 may decrease power losses, by providing an SPST switch to ground without resonance stopper for tuning capacitors and an SPxT (x=for example S or D, or more like 3, 4 . . . ) configuration with resonance stopper switches for tuning inductors, as in the example of FIG. 4. This power saving will now be explained in detail referring to FIGS. 5 through 14.

As mentioned, switches used herein may be implemented using a plurality of transistors. For the following analysis of power losses, a simple model for these switches will be used, as will now be discussed with reference to FIGS. 5 and 6.

Figure 5:
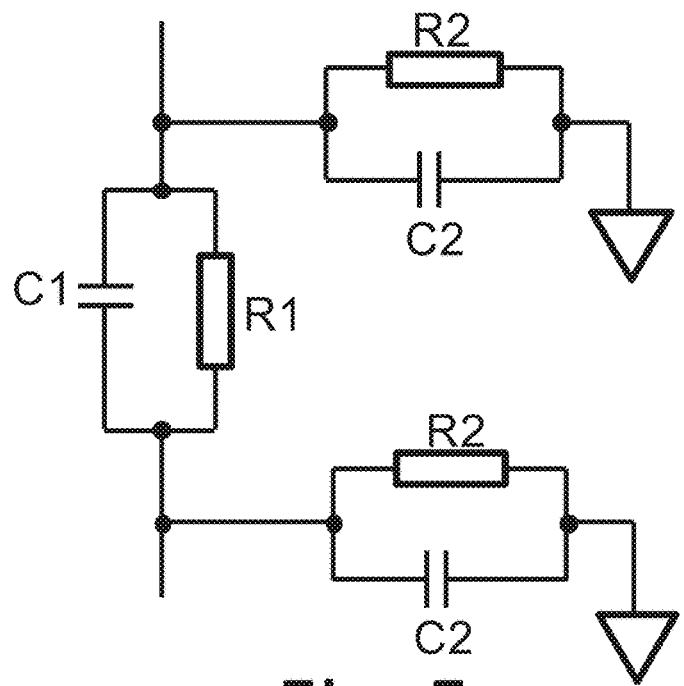
FIG. 5 is a simple equivalent circuit for a single transistor used for some explanations.

FIG. 5 shows a simple model of a single transistor. R1 represents a series resistance due to parasitics in the transistor and biasing resistors used for biasing the transistor, R2 represents a shunt resistance due to parasitics and biasing resistors, C1 represents a drain source capacitance of the transistor and C2 represents a substrate capacitance and other shunt to ground parasitic capacitance, which may be present, of the transistor.

FIG. 5 shows a schematic equivalent circuit of a switch including N transistors T1 to TN. Each transistor T1 to TN is represented by the equivalent circuit discussed with reference to FIG. 5. Voltages $V_1$ to $V_{N+1}$ designate peak voltages at nodes illustrated in FIG. 6, where a complete voltage applied over the switches is $V_1-V_{N+1}$.

A power loss $P_{total}=P_1+P_2$ when switching may be estimated according to:

$$P_1 \approx N * \frac{\left(\frac{V_1 - V_{N+1}}{N}\right)^2}{2 * R_1}$$

$$P_2 = \sum_{k=1}^{N} \left\{ \frac{V_k^2}{2 * R_2} + \frac{V_{k+1}^2}{2 * R_2} \right\}$$

Figure 7A:
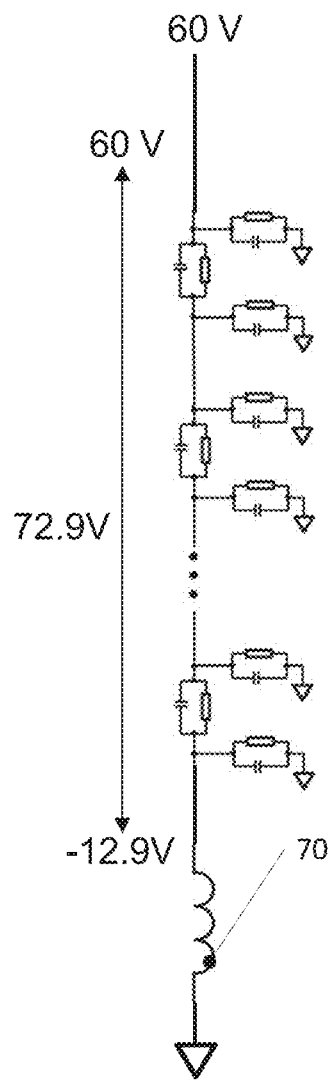
FIGS. 7A, 7B, 7C, 8A, 8B, 8C, 9A, 9B, 9C, 10A, 10B and 10C are diagrams or illustrating the behavior of switch devices for tuning in various configurations.
Figure 7B:
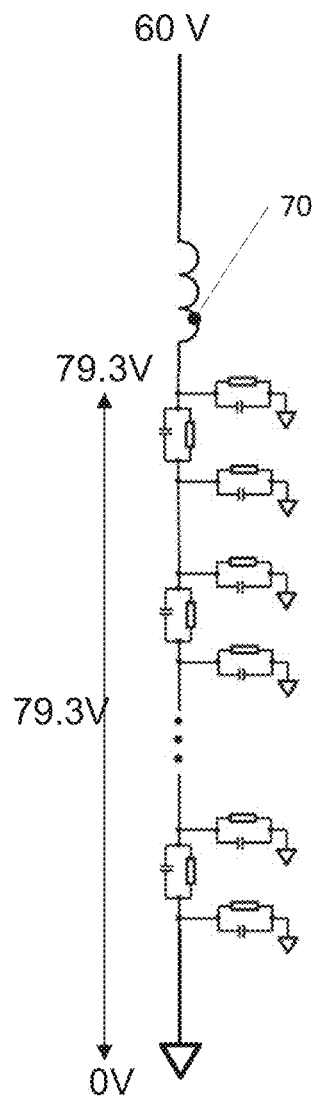
Figure 7C:
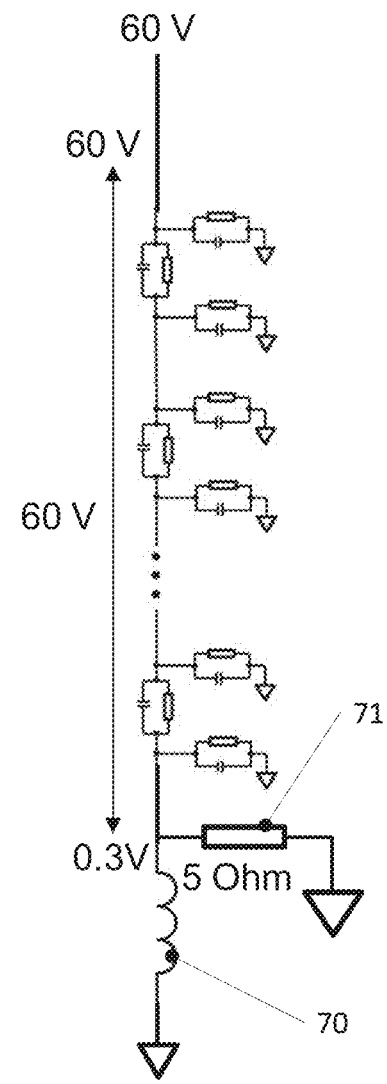
Figure 8A:
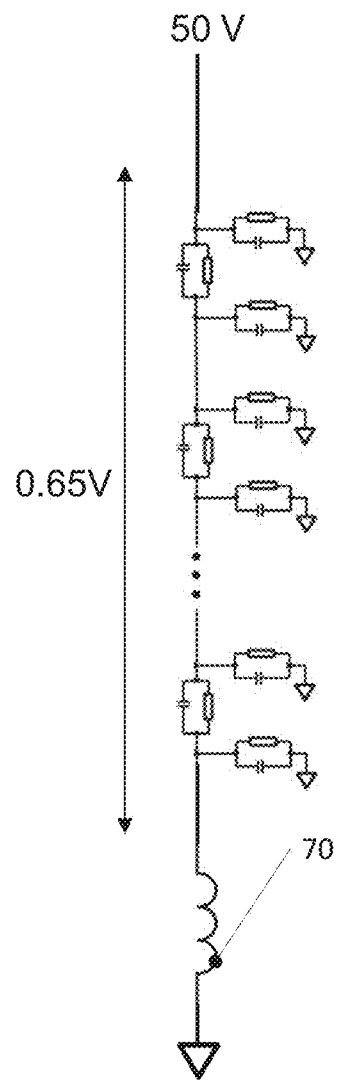
Figure 8B:
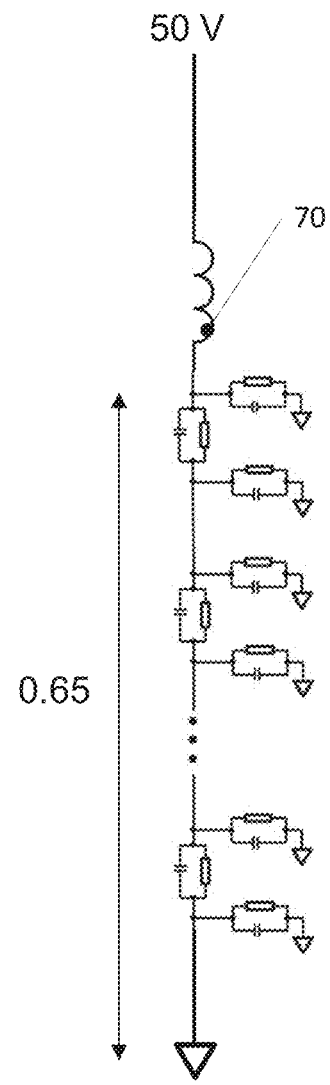
Figure 8C:
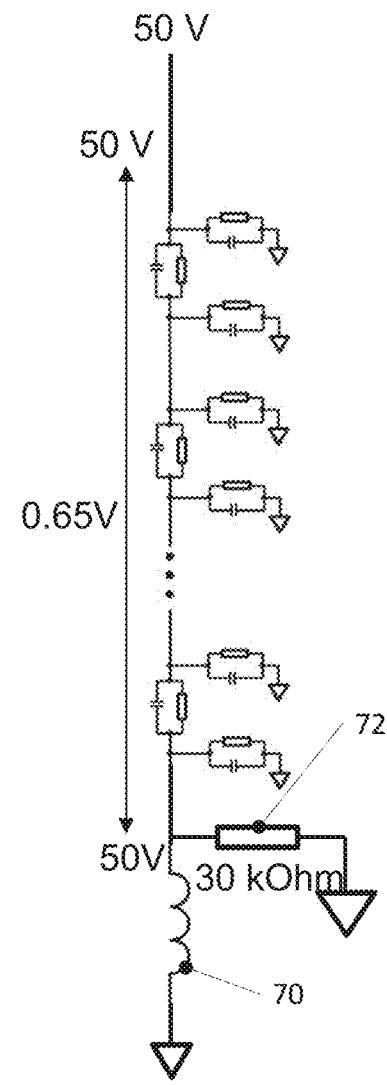
Figure 9A:
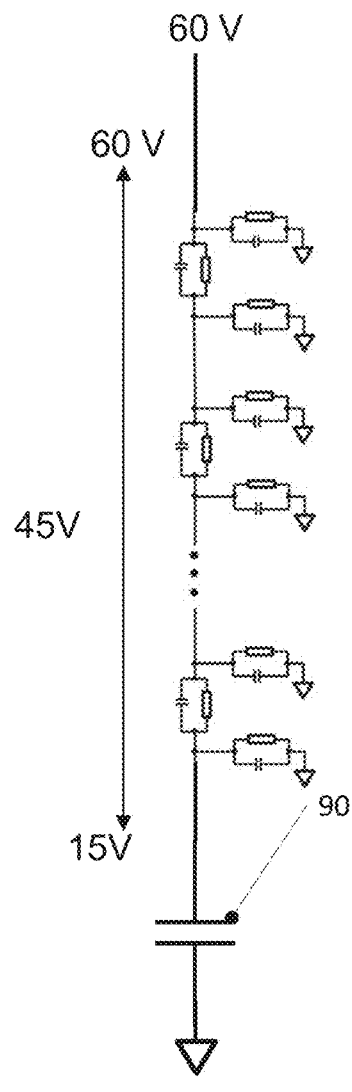
Figure 9B:
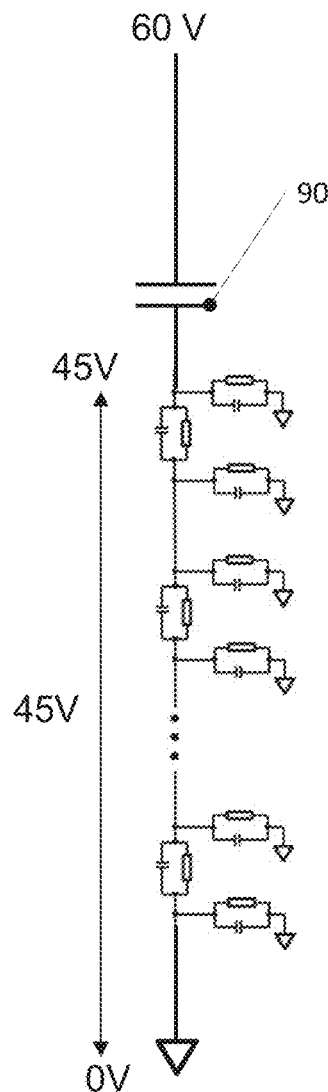
Figure 9C:
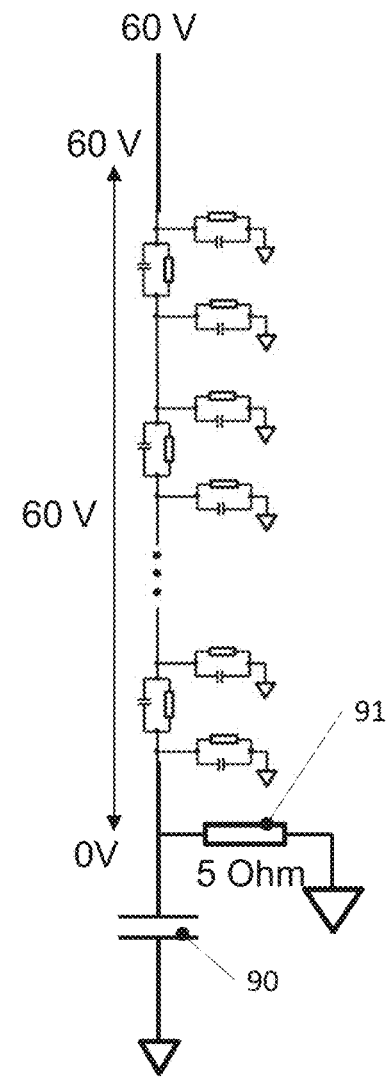
Figure 10A:
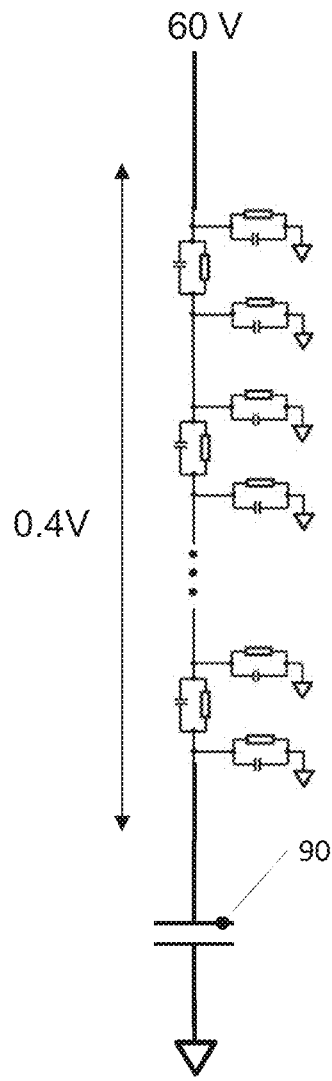
Figure 10B:
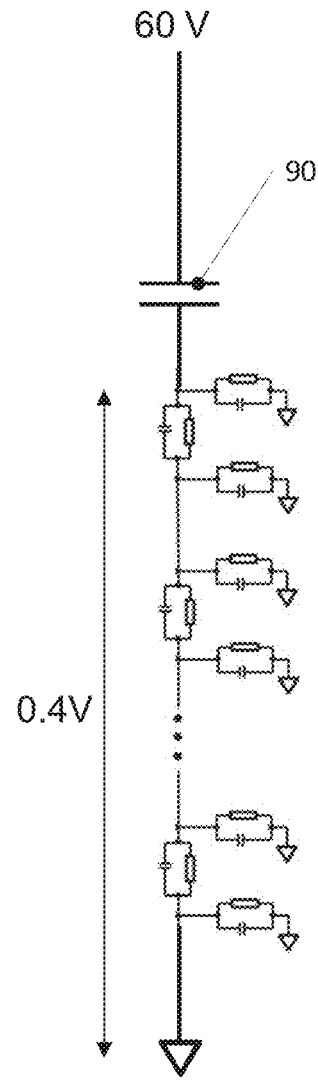
Figure 10C:
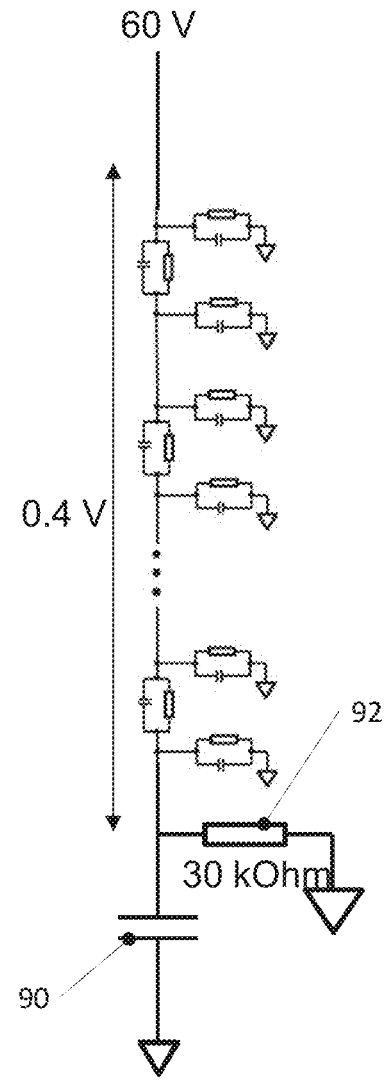

In the following, referring to FIGS. 7a to 10, various switch configurations for inductors and capacitors as tuning elements will be examined. FIGS. 7A-C show switch configurations for inductors where the respective inductor is disabled (disconnected from the antenna), FIGS. 8A-C show switch configuration for an inductor which is enabled (coupled to the antenna), FIGS. 9A-C show a case for a capacitor as tuning element which is disabled (capacitor disconnected for example from an antenna) and FIGS. 10A-C show a case where a capacitor as tuning element is enabled. Any numerical values given in the following serve only as example and are not to be construed as limiting, as actual values may depend on implementation.

Each of FIGS. 7 to 10 comprises subfigures A, B and C. Subfigure A, in each case, shows a configuration where the tuning element (inductor or capacitor) is coupled between the switch and ground. This may for example correspond to the coupling of inductor 42 in FIG. 4, but without third switch 26 serving as resonance stopper. Subfigure B, in each case, shows a configuration where a switch is coupled between the tuning element and ground. This corresponds to the coupling of capacitors 41A, 41B in FIG. 4, where switches 21A, 21B, respectively, are coupled between the respective capacitor 41A, 41B and ground. Subfigure C, in each case, corresponds to the situation of Subfigure A with an additional switch to ground (resonance stopper switch), as for a single one of inductors 42A, 42B with the respective other inductor and the respective switches omitted.

Figure 6:
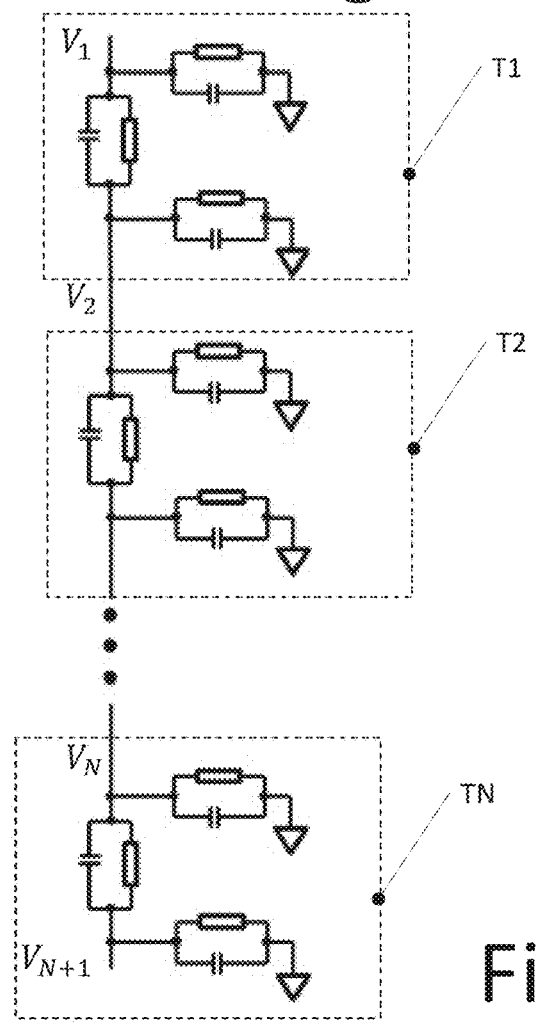
FIG. 6 is a simple equivalent circuit of a switch used in some embodiments, which is used for explanatory purposes.

The switch for enabling and disabling the tuning element is represented as in FIG. 6.

Now turning more specifically to the figures, FIGS. 7A-C illustrate disabled cases for an inductor 70 as tuning element, and a radio frequency voltage VRF of 60V present at the antenna.

In the disabled case, the switch enabling or disabling inductor 70 is high-ohmic, such that essentially an entire voltage drops over the switch (represented as shown in FIG. 6). This switch represents switch 21, 24 or 34 in FIGS. 2 and 3. In case of inductor 70, when switching an additional voltage occurs. This, in case of FIG. 7A, leads to a voltage drop of 72.9 V over the switch, in case of FIG. 7B voltage drop of 72.3 V over the switch. In case of FIG. 7C, for the off case, the additional resonance stopper switch to ground (switches 26, 36 in the embodiments of FIGS. 2 and 3) is switched on, which is represented by a low resistance 71, for example 5Ω, in FIG. 7C. In this case, due to this low-ohmic connection to ground, the effect of the inductor is diminished, leading to a voltage drop of only approximately 6.0 V.

With an inductance of an inductor 70 of 27 nH, a number of transistors N=20, a total capacitance of the switch in the off state of 0.2 pF and a substrate capacitance C2 of 5 fF and a frequency of 900 MHz, simulations were performed. A first set of simulations was performed for R1=30 kΩ), and R2=300 kΩ), and a second set of simulations was performed for R1=20 kΩ), and R2=300 kΩ. The following table shows the result:

| Figure | Tuner loss (Watt) @900 MHz | Total loss (Watt) @900 MHz |
|---|---|---|
| | R1 = 3 kΩ, R2 = 300 kΩ | |
| FIG. 7A | 0.105 | 0.122 |
| FIG. 7B | 0.178 | 0.216 |
| FIG. 7C | 0.112 | 0.112 |
| | R1 = 20 kΩ, R2 = 200 kΩ | |
| FIG. 7A | 0.098 | 0.114 |
| FIG. 7B | 0.195 | 0.233 |
| FIG. 7C | 0.121 | 0.121 |

Therefore, in this case, in the configuration with resonance stopper switch (FIG. 7C) the losses are smallest.

FIGS. 8A-8C show a case where tuning inductor 70 is enabled, i.e. the respective switch (for example 21, 24 or 34 in FIGS. 2 and 3) is switched on. As a radio frequency voltage VRF as an antenna, 50 V was taken. The lower voltage of 50 V in the simulation compared to FIGS. 7, 9 and 10 is due to the fact that when an inductive tuning element like tuning inductor 70 is enabled, the peak voltage drops. As the switch is on, the voltage drop over the switch is low, for example 0.65 V in the example of FIGS. 8A-8C. The resonance stopper switch to ground in case of FIG. 8C is switched off, represented by a high resistance of 30 kΩ, for simulation purposes. As an inductance for inductor 70, again 27 nH was assumed, N was again 20 and the on resistance of the switch enabling inductor 70 was assumed to be 2Ω. Again, for a frequency of 900 MHz and the same values of R1 and R2 as before, the following losses were obtained:

| Figure | Tuner loss (Watt) @900 MHz | Total loss (Watt) @900 MHz |
|---|---|---|
| R1 = 3 kΩ, R2 = 300 kΩ | | |
| FIG. 8A | 0.253 | 0.501 |
| FIG. 8B | 0.103 | 0.352 |
| FIG. 8C | 0.294 | 0.543 |
| R1 = 20 kΩ, R2 = 200 kΩ | | |
| FIG. 8A | 0.336 | 0.507 |
| FIG. 8B | 0.103 | 0.352 |
| FIG. 8C | 0.378 | 0.626 |

Next, the cases for a capacitor as tuning element will be discussed. FIGS. 9A to 9C show various configurations with a capacitor 90 in an off mode, where in FIG. 9C the switched on connection to ground (switch 26 or 36 for example) is again represented by a resistance 91 with a value of 5Ω, similar to FIG. 7C. Compared to the inductor case, due to the different behaviors of capacitors and inductors, the voltage drop for a voltage of the antenna node of 60 V is reduced and not increased is in the inductor case.

Simulations were made for a value of the tuning capacitor 90 of 0.6 pF, and otherwise the same values as for the inductor case of FIGS. 7A-7C. The results are as follows:

| Figure | Tuner loss (Watt) @900 MHz | Total loss (Watt) @900 MHz |
|---|---|---|
| R1 = 3 kΩ, R2 = 300 kΩ | | |
| FIG. 9A | 0.108 | 0.109 |
| FIG. 9B | 0.048 | 0.050 |
| FIG. 9C | 0.112 | 0.112 |
| R1 = 20 kΩ, R2 = 200 kΩ | | |
| FIG. 9A | 0.135 | 0.136 |
| FIG. 9B | 0.052 | 0.054 |
| FIG. 9C | 0.121 | 0.121 |

Here, the configuration of FIG. 9B shows the lowest losses.

Finally, FIG. 10 shows the capacitor case of FIG. 9 in an on mode. In FIG. 10C, the now switched off resonance stopper switch to ground, is, similar to FIG. 8C, represented by a resistor 92 having a high resistance value of 30 kΩ. Simulations were performed for an antenna voltage VRF of 60 V and otherwise the same values as before.

Simulation results are as follows:

| Figure | Tuner loss (Watt) @900 MHz | Total loss (Watt) @900 MHz |
|---|---|---|
| R1 = 3 kΩ, R2 = 300 kΩ | | |
| FIG. 10A | 0.297 | 0.315 |
| FIG. 10B | 0.042 | 0.060 |
| FIG. 10C | 0.357 | 0.375 |
| R1 = 20 kΩ, R2 = 200 kΩ | | |
| FIG. 10A | 0.417 | 0.435 |
| FIG. 10B | 0.042 | 0.060 |
| FIG. 10C | 0.477 | 0.495 |

Also here, the configuration of FIG. 10B shows the lowest total loss.

Therefore, in the enabled case, it is always the configuration B with the highest losses. In the disabled case (FIGS. 7A-7C and 9A-9C), for inductors the configuration with resonance stopper switch (FIG. 7C) has the lowest losses. Therefore, the resonance stopper may be helpful if resonances may occur at higher frequency bands.

Figure 11A:
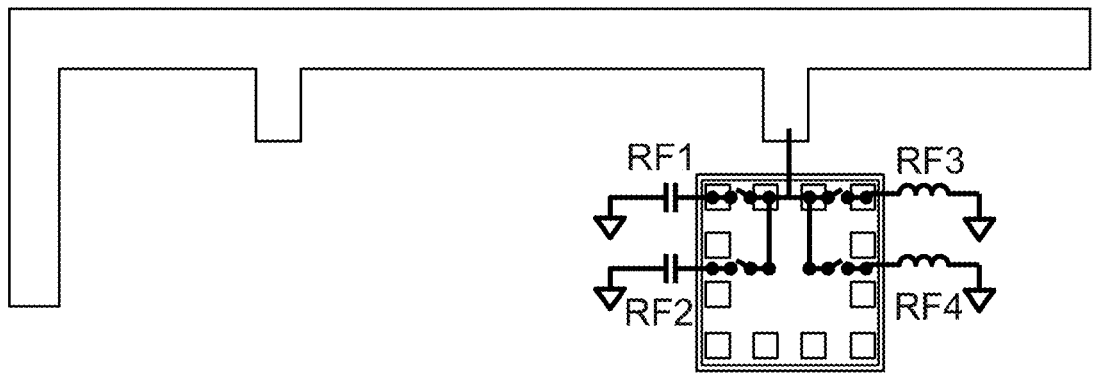
FIG. 11A shows a system according to a comparative example.
Figure 12A:
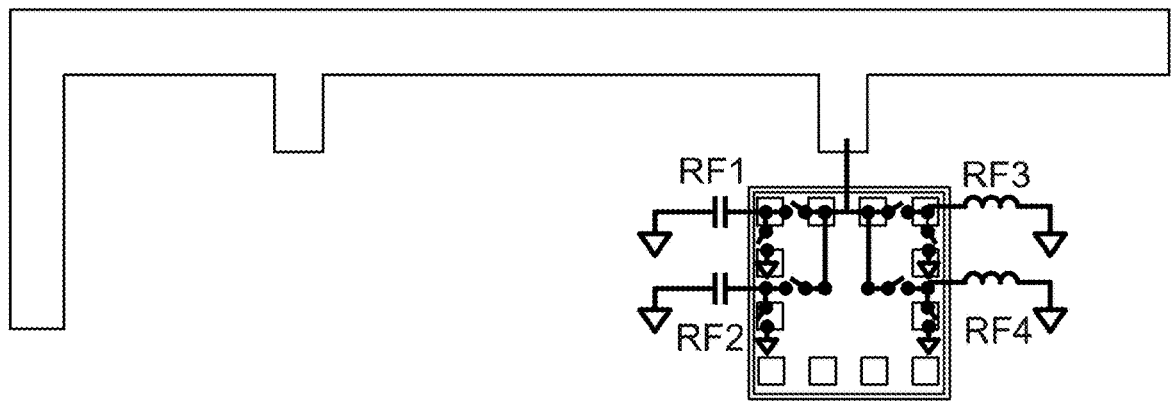
FIG. 12A shows a system according to a comparative example.
Figure 13A:
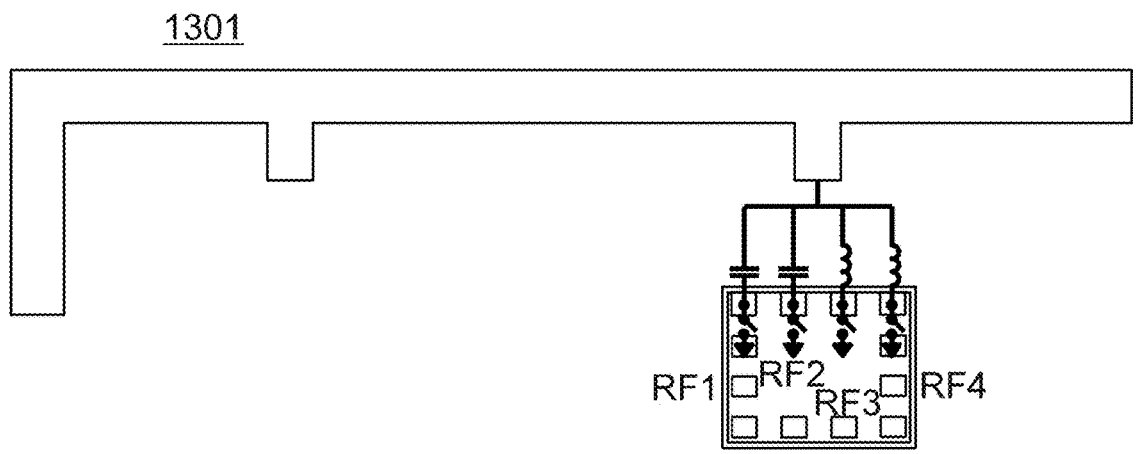
FIG. 13A shows a system according to a comparative example.

The switch devices of FIGS. 2 and 3 and the system of FIG. 4 therefore show an optimization of losses, where a resonance stopper switch is provided for inductors, whereas capacitors may be used with a configuration as shown in FIGS. 11A, 12A and 13A. To illustrate this further, tuner losses over frequency were simulated for various configurations. In all configurations, two tuning inductors and two tuning capacitors were used.

Figure 11B:
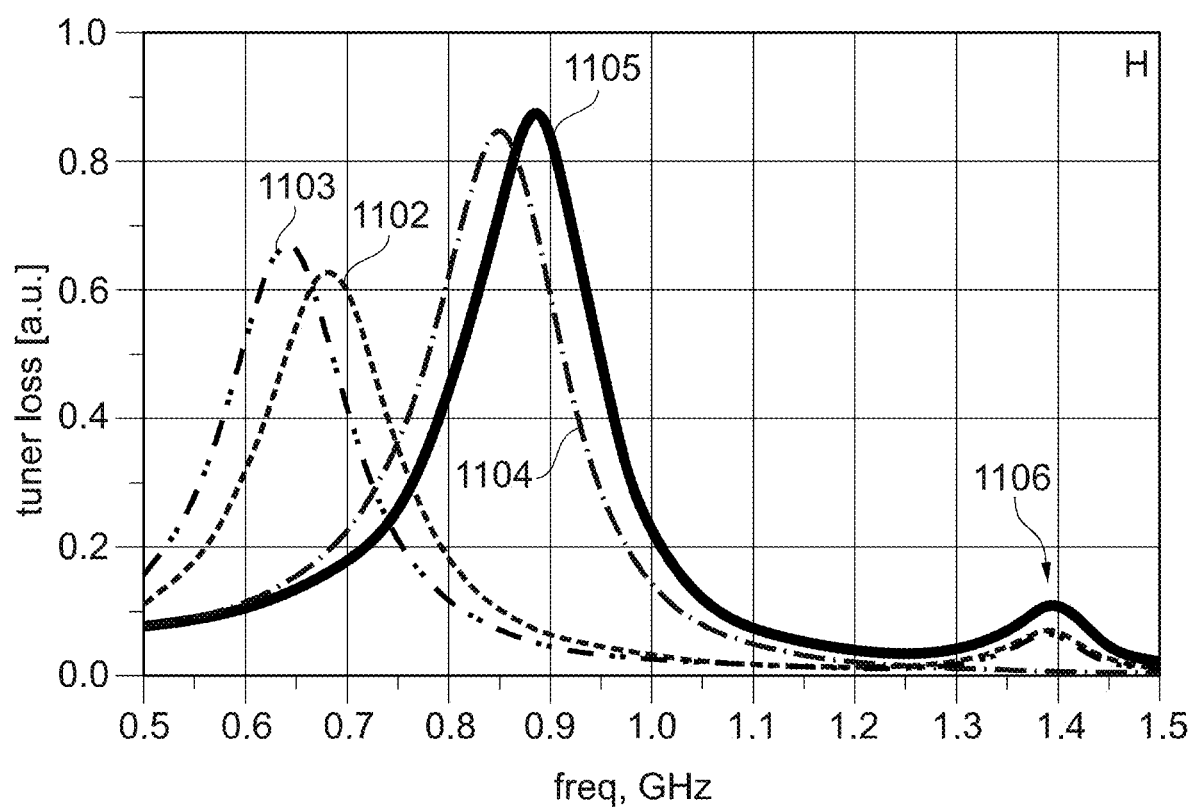
FIG. 11B shows simulation results for the system of FIG. 11A.

FIG. 11A shows a comparative example system 1101, where switches are in a SP4T (Single Pole Quadruple Throw) configuration coupled to an antenna, and an inductance value of inductor RF1 was 1 pF, a capacitance of capacitor RF2 was 0.5 pF, an inductance of inductor RF3 was 33 nH and an inductance of inductor RF4 was 27 nH. FIG. 11B shows tuner losses for each of these four tuning elements enabled individually over frequency. A curve 1102 shows tuner losses for RF1 enabled, a curve 1103 tuner losses for RF2 enabled, a curve 1104 a case for RF3 enabled and a curve 1105 a case for RF4 enabled. As can be seen, at a frequency of about 1.4 GHz over frequency, as marked by reference numeral 1106, an unwanted resonance occurs.

FIG. 12A shows a comparative example system 1201 where a configuration with resonance stopper switch is used for all tuning elements RF1 to RF4. Values are the same as in case of FIG. 11A. An on resistance of the resonance stopper switch to ground, similar to the previously discussed simulations, was assumed to be 5Ω, and an off resistance 30 kΩ.

Figure 12B:
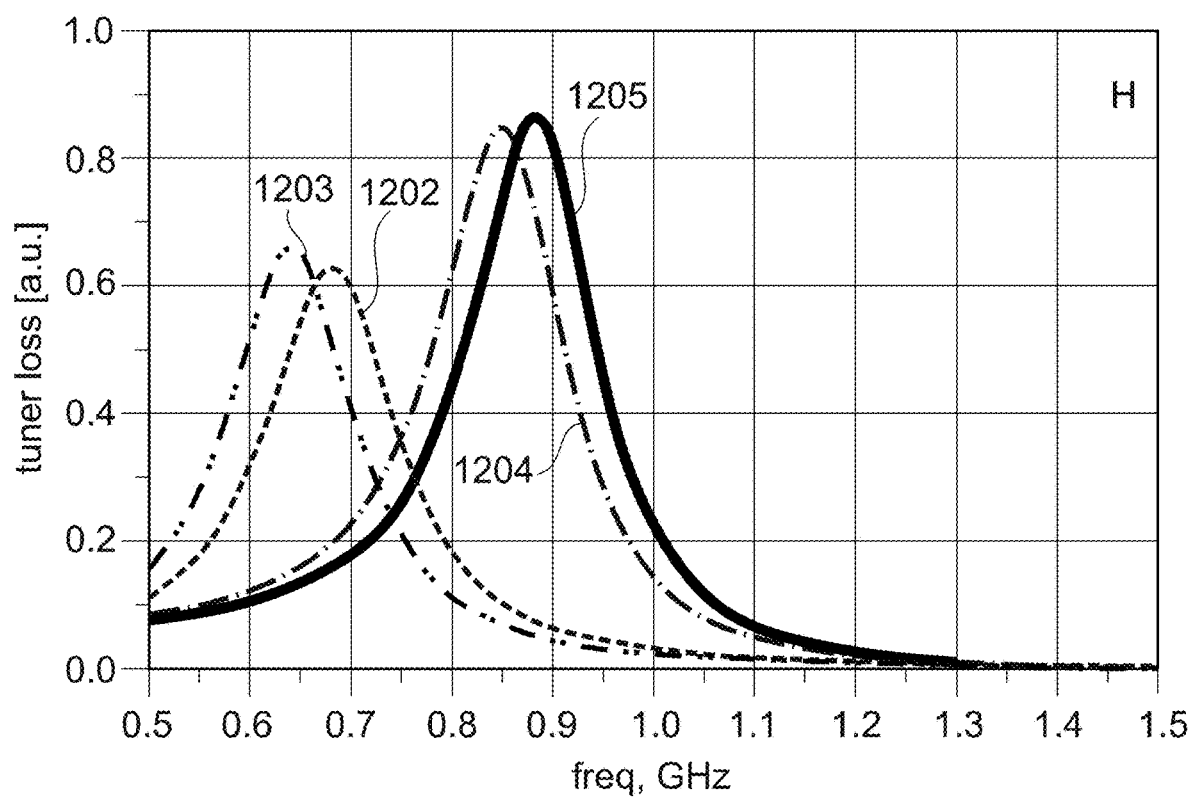
FIG. 12B shows simulation results for the system of FIG. 12A.

FIG. 12B shows corresponding simulations, a curve 1202 for RF1 enabled, a curve 1203 for RF2 enabled, a curve 1204 for RF3 enabled and a curve 1205 for RF4 enabled. Losses are comparable to FIG. 11B, and the resonance is disappeared.

Figure 13B:
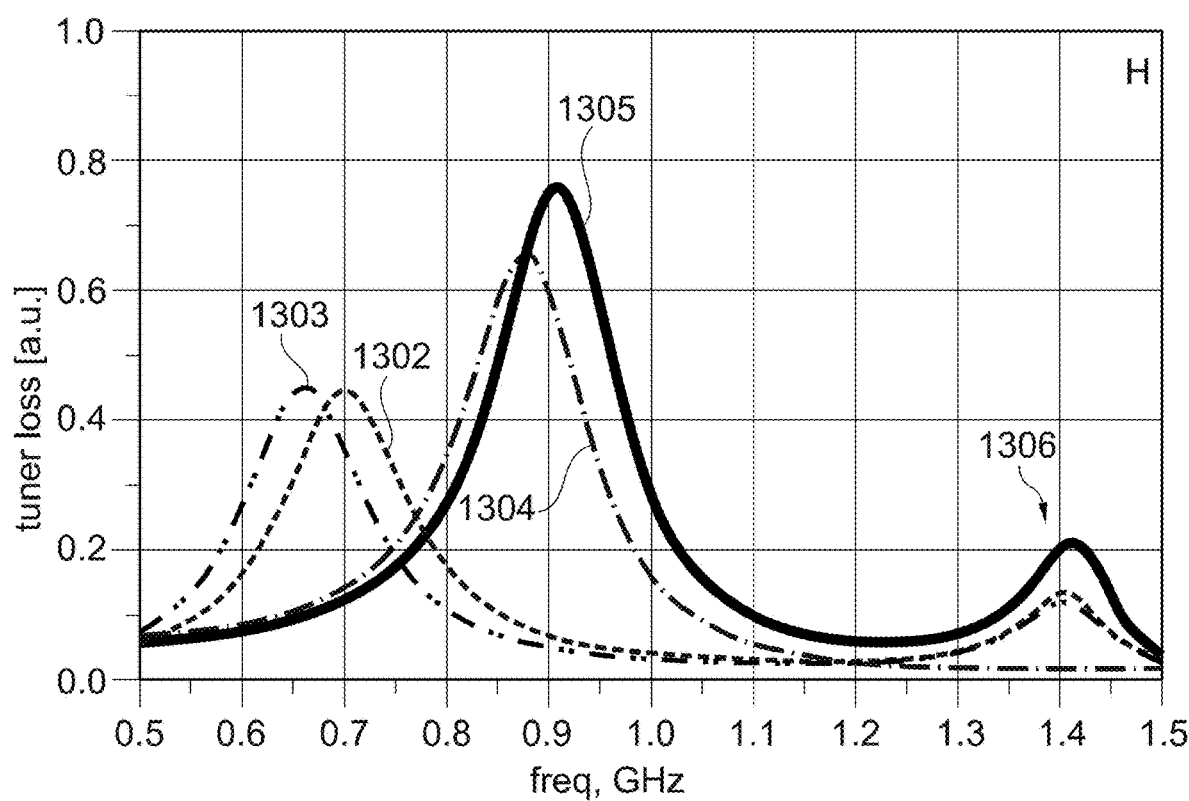
FIG. 13B shows simulation results for the system of FIG. 13A.
Figure 14:
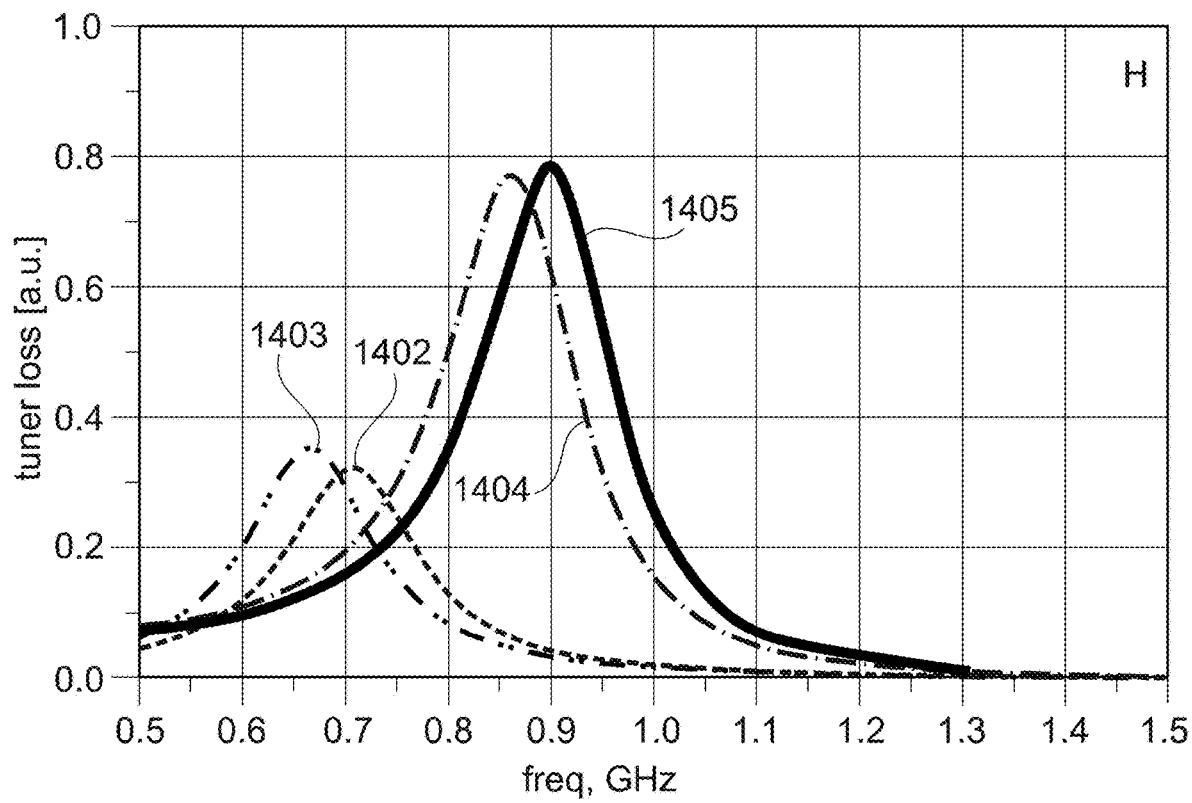
FIG. 14 shows simulation results for the system of FIG. 4.

FIG. 13A shows a comparative example system 1301, where all four tuning elements RF1 to RF4 are coupled between an antenna and a switch to ground, i.e. are connected in an SPST configuration without resonance stopper switch. FIG. 13B shows corresponding simulations. A curve 1302 shows results for RF1 enabled, a curve 1302 shows results for tuning element RF2 enabled, a curve 1304 shows results for tuning element RF3 enabled, and a curve 1305 shows results for tuning element RF4 enabled. For frequencies about 1.2 GHz, losses are reduce compared to the simulations of FIGS. 11A and 11B. However, at about 1.4 GHz again unwanted resonances 1306 appear increasing overall losses.

FIG. 14B is a simulation of the embodiment of FIG. 4. Tuning capacitor 41A corresponds to RF1 in the comparative example, tuning capacitor 41B corresponds to RF2 in the comparative example, tuning inductor 42A corresponds to RF3 in the comparative example and tuning inductor 42B corresponds to RF4 in the comparative example, and corresponding values were used. In the simulation of FIG. 14B, a curve 1402 corresponds to tuning capacitor 41A enabled, a curve 1403 are results for tuning capacitor 41B enabled, a curve 1404 are results for tuning inductor 42A enabled, and a curve 1405 simulation results for tuning inductor 42B enabled. As can be seen, no unwanted resonance occurs at higher frequencies, and losses are generally low (compared to FIG. 13B, slightly higher for curves 1404 and 1405 compared to curves 1304 and 1305 of FIG. 13B, and lower for curves 1402 and 1403 compared to curves 1302 and 1302 of FIG. 13B).

Therefore, by switch devices and systems according to embodiments which combine SPST switches without resonance stopper switch and switches including resonance stopper switches, reduced losses may be obtained comparing to systems using only one type of switch configuration.

Figure 15:
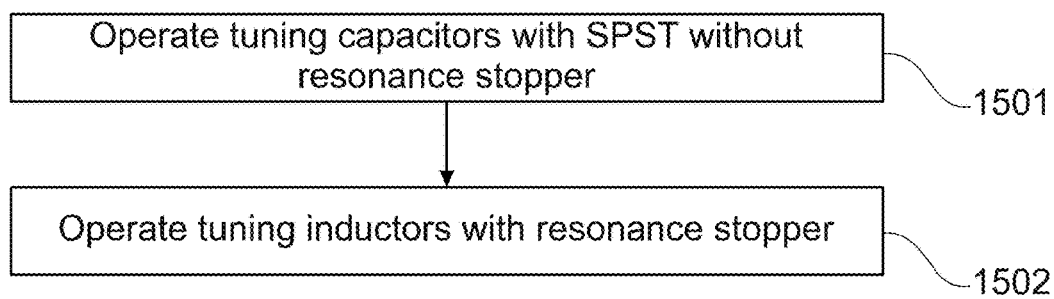
FIG. 15 shows a flow chart illustrating a method according to some embodiments.

FIG. 15 is a flow chart illustrating a method according to some embodiments. The order in which the method of FIG. 15 is presented is not to be construed as limiting. The method of FIG. 15 may be implemented using switch devices and systems of the previously discussed embodiments.

At 1505, the method comprises operating one or more tuning capacitors with switches in a SPST configuration without resonance stopper switches, for example switches 21 of FIGS. 2 and 3. In particular, the switches may be provided between the tuning capacitors and ground.

At 1502, the method comprises operating one or more tuning inductors with resonance stopper switches, for example in an SPST configuration either resonance stopper switches as shown in FIG. 2 (switches 24, 26) or a SPDT configuration with resonance stoppers (for example switches 24, 26, 34, 36 of FIG. 3). As explained previously, in this way losses may be reduced and unwanted resonances at higher frequencies may be avoided.

Some embodiments are defined by the following examples.

Example 1. An integrated switch device, comprising:
a set of first ports,
a set of first switches, wherein each first switch is coupled between a respective first port and ground, wherein within the integrated switch device the first ports are only coupled to the first switches,
a set of second ports,
a set of third ports,
a set of second switches, wherein each second switch is coupled between a respective second port and a respective third port,
a set of third switches, wherein each switch of the set of third switches is coupled between a respective third port and ground.

As the first ports are only coupled with the first switches and therefore may be selectively coupled to ground only, the may be used to form SPST switches without resonance stopper.

Example 2. The switch device of Example 1, wherein a number of the first ports is equal to a number of the first switches, and wherein a number of the second ports is equal to a number of the third ports, a number of the second switches and a number of the third switches.

Example 3. The switch device of Example 1 or 2, further comprising:
a set of fourth ports,
a set of fifth switches, wherein each fifth switch is coupled between a respective second port and a respective fourth port,
a set of sixth switches, wherein each sixth switch is coupled between a respective fourth port and ground.

Example 3 expands the SPST switch with resonance stopper to SPDT with resonance stopper.

Example 4. The switch device of Example 3,
wherein a number of the fourth ports is equal to a number of the fifth switches and a number of the sixth switches, and
wherein the number of the fourth ports is equal to or smaller than a number of the second ports.

In the "smaller than" case, there is at least one SPST with resonance stopper switch configuration and at least one SPDT with resonance stopper switch configuration.

Example 5. The switch device of any one of Examples 1 to 4, wherein at least one of the set of first, second, third, fourth, fifth or sixth switches comprises stacked transistor switches.

Example 6. A system, comprising:
a set of single pole single throw, SPST, switches configured to selectively couple respective first ports to ground, wherein each port of the set of first ports is coupled to a first terminal of a capacitor,
a set of single pole x throw, SPxT, switches selectively configured to couple a set of second ports selectively either to ground to one or more inductors.

Example 7. The system of Example 6, wherein second terminals of the capacitors of the set of capacitors and the set of second ports are coupled to an antenna.

Example 8. The system of Example 6 or 7, wherein the SPxT switches are selected from single pole single throw switches or single pole double throw switches.

Example 9. The system of any one of Examples 6 to 8, wherein the set of SPxT switches comprises a set of second switches, wherein each second switch is coupled between a respective second port and a respective inductor, and
a set of third switches, wherein each switch of the set of third switches is coupled between a respective inductor and ground.

Example 10. The switch system of Example 9, wherein the set of SPxT switches further comprises a set of fifth switches, wherein each fifth switch is coupled between respective second port and a respective second inductor, and
a set of sixth switches, wherein each sixth switch is coupled between respective inductor and ground.

Example 11. The system of Example 10, wherein a number of fifth switches is equal to a number of sixth switches, and
wherein a number of second switches is equal to a number of third switches and
wherein a number of second ports is equal to a number of second switches.

Example 12. The system of Example 11, wherein a number of fifth switches is equal to or smaller than a number of second switches.

Example 13. The system of any one of Examples 6 to 12, wherein the set of SPST switches and the set of SPxT switches are included in the switch device of any one of Examples 1 to 5.

Example 14. A method, comprising:

operating tuning capacitors using single pole single throw switches without resonance stopper switch to selectively couple tuning capacitors to ground, and operating tuning inductors by selectively coupling the tuning inductors to ground or to an antenna node.

Example 15. The method of Example 14, wherein the method uses the switch device of any one of Examples 1 to 5 or operates the system of any one of Examples 6 to 12.

Example 16. A system, comprising:

an antenna node, a switch device, the switch device comprising:

a set of first ports, a set of first switches, wherein each first switch is coupled between a respective first port and ground, a set of second ports, a set of third ports, a set of second switches, wherein each second switch is coupled between a respective second port and a respective third port, a set of third switches, wherein each switch of the set of third switches is coupled between a respective third port and ground, a set of first impedances, wherein each first impedance is coupled between a respective first port and the antenna nod, wherein each second port is coupled to the antenna node, and a set of second impedances, wherein each second impedance is coupled between a respective third port and ground.

The features of the switch devices of Examples 1 to 15 may also be added to the switch device of Example 16.

Example 17. The system of Example 16, wherein the first impedances comprise capacitors, and the second impedances comprise inductors.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated switch device, comprising:
a set of first ports;
a set of first switches, wherein each first switch of the set of first switches is coupled between a respective first port of the set of first ports and ground, and wherein the first ports are only coupled to the first switches within the integrated switch device;
a set of second ports;
a set of third ports;
a set of second switches, wherein each second switch is coupled between a respective second port of the set of second ports and a respective third port of the set of third ports; and
a set of third switches, wherein each switch of the set of third switches is coupled between the respective third port and ground.

2. The integrated switch device of claim 1, wherein a number of the first ports is equal to a number of the first switches, and wherein a number of the second ports is equal to a number of the third ports, a number of the second switches and a number of the third switches.

3. The integrated switch device of claim 1, further comprising:
a set of fourth ports;
a set of fifth switches, wherein each fifth switch is coupled between the respective second port and a respective fourth port; and
a set of sixth switches, wherein each sixth switch is coupled between the respective fourth port and ground.

4. The integrated switch device of claim 3,
wherein a number of the fourth ports is equal to a number of the fifth switches and a number of the sixth switches; and
wherein the number of the fourth ports is equal to or smaller than a number of the second ports.

5. The integrated switch device of claim 1, wherein at least one of the set of first, second, or third switches comprises stacked transistor switches.

6. The integrated switch device of claim 1, wherein:
the first set of switches comprises a set of single pole single throw (SPST) switches configured to selectively couple respective first ports of the set of first ports to ground, wherein each port of the set of first ports is coupled to a first terminal of a capacitor; and
the second set of switches comprises a set of single pole x throw (SPxT) switches selectively configured to couple second ports of the set of second ports selectively either to ground or to one or more inductors.

7. A system, comprising:
a set of single pole single throw (SPST) switches configured to selectively couple a set of first ports to ground, wherein each port of the set of first ports is coupled to a first terminal of a capacitor of a set of capacitors; and
a set of single pole x throw (SPxT) switches selectively configured to couple a set of second ports selectively either to ground or to one or more inductors, wherein the set of SPxT switches comprises:
a set of second switches, and wherein each second switch of the second of second switching is coupled between a respective second port and a respective inductor of the one or more inductors,
a set of third switches, wherein each switch of the set of third switches is coupled between the respective inductor and ground
a set of fifth switches, wherein each fifth switch is coupled between the respective second port and a respective second inductor of the one or more inductors; and
a set of sixth switches, wherein each sixth switch is coupled between the respective second inductor and ground.

8. The system of claim 7, wherein second terminals of capacitors of the set of capacitors and the set of second ports are coupled to an antenna.

9. The system of claim 7, wherein SPxT switches of the set of SPxT switches are selected from the group consisting of SPST switches and single pole double throw (SPDT) switches.

10. The system of claim 7, wherein a number of fifth switches is equal to a number of sixth switches, and
wherein a number of second switches is equal to a number of third switches and
wherein a number of second ports is equal to a number of second switches.

11. The system of claim 10, wherein a number of fifth switches is equal to or smaller than a number of second switches.

12. A system, comprising:
an antenna node; and
a switch device comprising:
- a set of first ports,
- a set of first switches, wherein each first switch is coupled between a respective first port and ground,
- a set of second ports, wherein each second port is coupled to the antenna node,
- a set of third ports,
- a set of second switches, wherein each second switch is coupled between a respective second port and a respective third port,
- a set of third switches, wherein each switch of the set of third switches is coupled between the respective third port and ground,
- a set of first impedances, wherein each first impedance of the set of first impedances is coupled between the respective first port and the antenna node, and
- a set of second impedances, wherein each second impedance of the set of second impedances is coupled between the respective third port and ground.

13. The system of claim 12, further comprising an antenna coupled to the antenna node.

14. The system of claim 12, wherein:
the set of first switches comprises a set of single pole single throw (SPST) switches;
the set of second switches comprises a first set of single pole x throw (SPxT) switches; and
the set of third switches comprises a second set of single pole x throw (SPxT) switches.

15. The system of claim 12, wherein the first impedances of the set of first impedances comprise capacitors, and the second impedances of the set of second impedances comprise inductors.

16. A method of operating an integrated switch device, comprising: a set of first ports; a set of first switches, wherein each first switch of the set of first switches is coupled between a respective first port of the set of first ports and ground, and wherein the first ports are only coupled to the first switches within the integrated switch device; a set of second ports; a set of third ports; a set of second switches, wherein each second switch is coupled between a respective second port of the set of second ports and a respective third port of the set of third ports; and a set of third switches, wherein each switch of the set of third switches is coupled between the respective third port and ground, the method comprising:
tuning an antenna via a set of capacitors coupled between the antenna and the set of first ports and a set of inductors coupled between the set of second ports and ground, wherein the antenna is connected to the set of second ports.

17. The method of claim 16, wherein tuning comprises decoupling an inductor of the set of inductors from the antenna by opening a switch of the set of second switches and closing a switch of the third set of switches, wherein the switch of the third set of switches is a resonance stopper switch.

18. The system of claim 7, wherein:
the set of SPST switches are configured to selectively couple the set of first ports directly to ground; and
the set of SPxT switches are selectively configured to couple the set of second ports selectively either directly to ground or to the one or more inductors.

* * * * *